United States Patent [19]

Widlar

[11] Patent Number: 4,656,496
[45] Date of Patent: Apr. 7, 1987

[54] POWER TRANSISTOR EMITTER BALLASTING

[75] Inventor: Robert J. Widlar, Puerto Vallarta, Mexico

[73] Assignee: National Semiconductor Corporation, Santa Clara, Calif.

[21] Appl. No.: 698,043

[22] Filed: Feb. 4, 1985

[51] Int. Cl.[4] .................... H01L 29/72; H01L 27/06; H01L 29/04; H01L 23/48
[52] U.S. Cl. ........................................ 357/36; 357/51; 357/71; 357/59
[58] Field of Search .................... 357/36, 34, 51, 59, 357/71

[56] References Cited

U.S. PATENT DOCUMENTS

| 4,136,354 | 1/1979 | Dobkin | 357/36 |
| 4,297,597 | 10/1981 | Kimura | 357/36 |
| 4,370,670 | 1/1983 | Nawata et al. | 357/36 |

FOREIGN PATENT DOCUMENTS

| 55-158668 | 12/1980 | Japan | 357/36 |
| 2075753 | 11/1981 | United Kingdom | 357/36 |

Primary Examiner—William D. Larkins
Assistant Examiner—John Lamont
Attorney, Agent, or Firm—Gail W. Woodward

[57] ABSTRACT

A power transistor structure that is well suited to both switching and lower-voltage linear applications is displayed. A key element of the design is thin-film ballast resistors that act as a second level of interconnect. They can be connected to or insulated from the overlying metal and the underlying silicon, except where contact holes are provided. Thus, an intricate structure having small emitters with individual ballast resistors can be fabricated below the wide metal busses required to carry current out of a large power array. The result is a ballasting scheme that can be optimized for a wide range of linear and switching applications while making efficient use of metallization which often limits the size of power arrays. This is especially important in the design of IC power transistors where both the emitter and collector current must be conducted out of the array with surface metallization. The integration of a thermal sensor into the array that responds to hot spots for controlling the peak junction temperature greatly increases the power ratings that can be guaranteed, while providing more effective overload protection.

7 Claims, 4 Drawing Figures

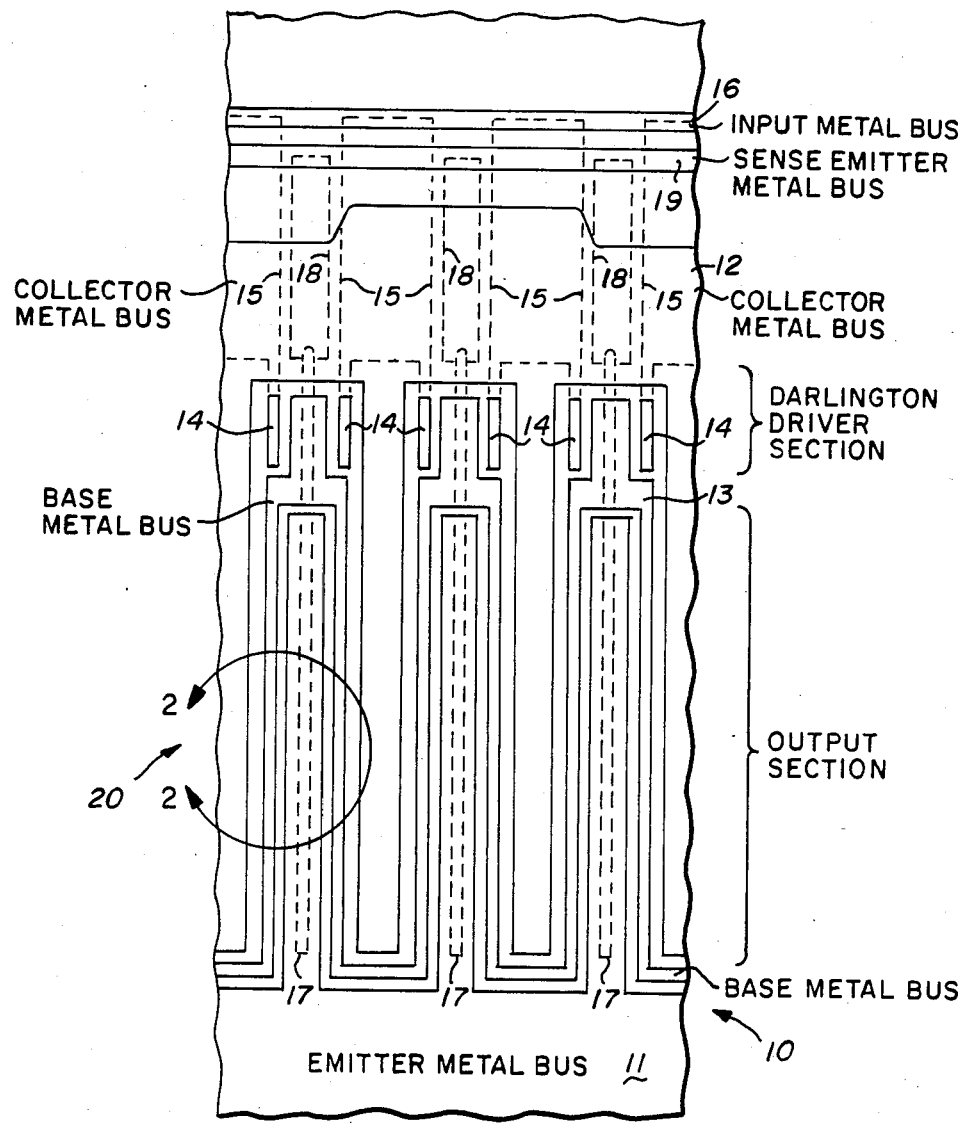
Fig_1

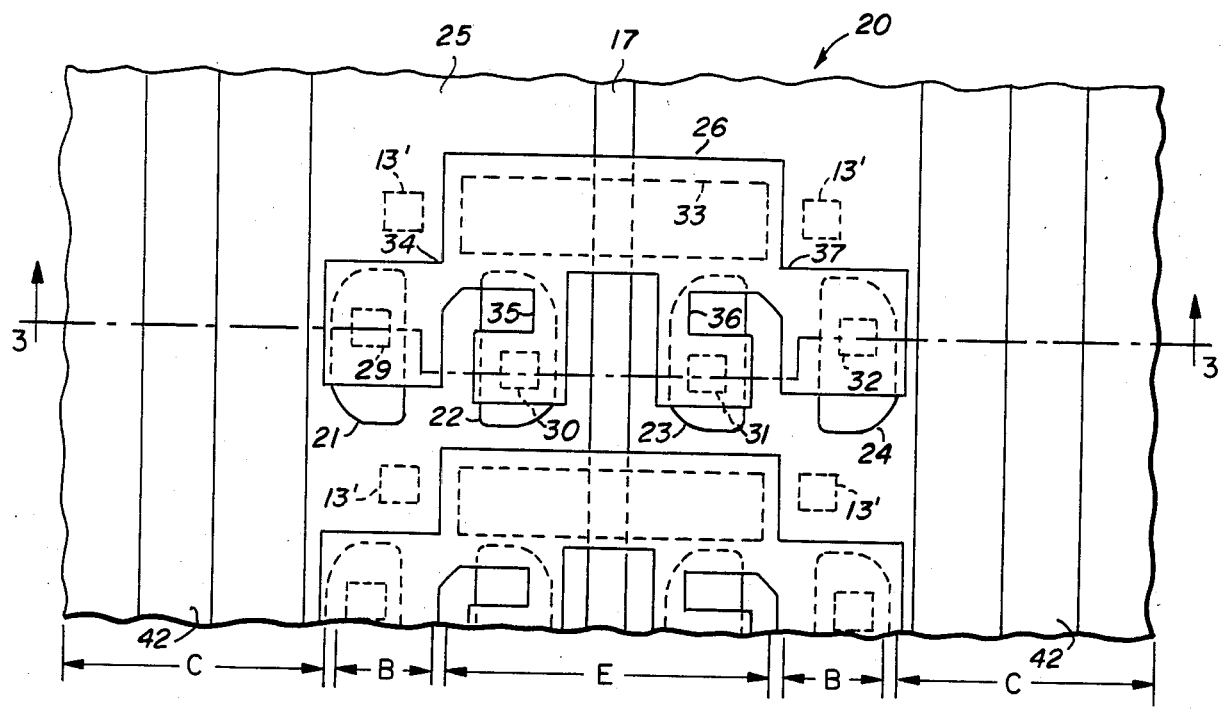
Fig_2
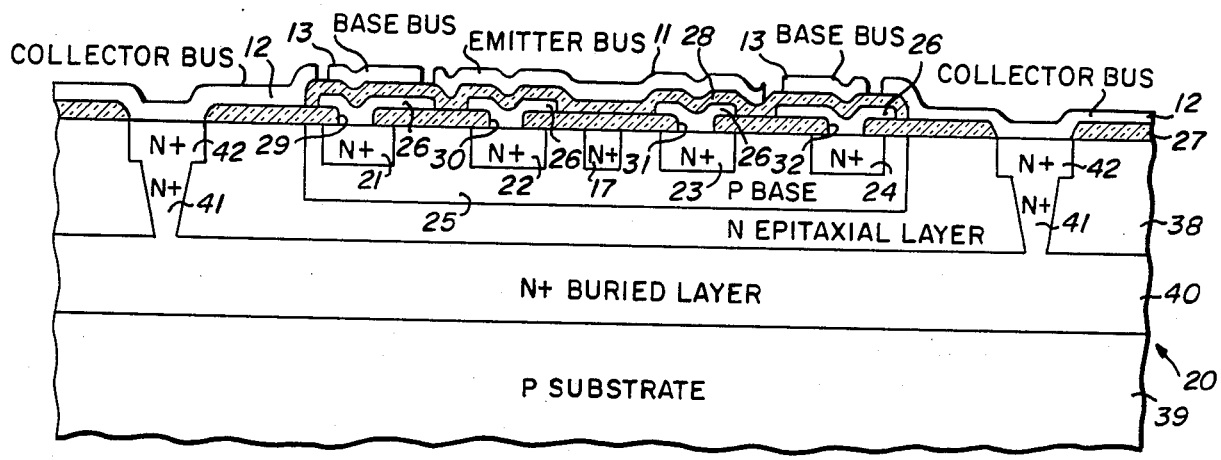
Fig_3
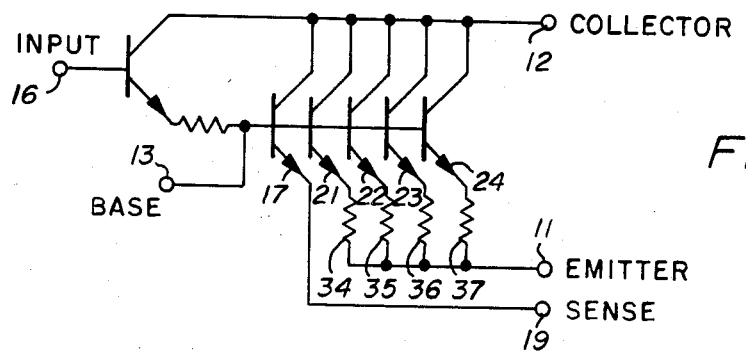
Fig_4

POWER TRANSISTOR EMITTER BALLASTING

BACKGROUND OF THE INVENTION

The invention relates to emitter ballasted power transistors primarily intended for use in integrated circuit (IC) structures. My U.S. Pat. No. 4,441,116 describes a bipolar power transistor that is designed to operate at high collector voltage and is not subject to secondary breakdown. This is accomplished by a base ballasting arrangement using a junction field effect transistor incorporated into the power transistor base. However, the patent teaches the nature and virtues of emitter ballasting. This device, as well as most prior art power transistors, is intended primarily for discrete device structures. These employ a back-side collector contact that is also a heat sink which acts to absorb the heat generated within the power transistor. When a power transistor is incorporated into an IC structure, typically all of the device contacts must be located on one chip face. This substantially increases the problems of making electrical contact to the power transist or electrodes.

U.S. Pat. Nos. 4,136,354 and 4,146,903 issued to Robert C. Dobkin and are assigned to the assignee of the present invention. These patents describe a sense emitter incorporated into a power transistor device. The sense emitter is located close enough to the transistor power emitter so that the heat developed in the power transistor will be sensed. A remote emitter is employed as a reference so that a thermal gradient can be determined and employed to limit the power transistor conduction to a safe level.

U.S. Pat. No. 3,504,239 discloses a power transistor which employs a distributed resistor array that interconnects a plurality of separate emitters. The array also provides the desired emitter ballasting. Polycrystalline silicon is one suggested resistive material.

SUMMARY OF THE INVENTION

It is an object of the invention to provide an IC power transistor in which a polycrystalline silicon layer forms subsurface emitter resistors for ballasting.

It is a further object of the invention to form a plurality of emitter areas in an IC power transistor in which the emitter areas are contacted by a subsurface resistive film layer to provide emitter ballasting with the same layer being employed as a cross-under contact layer.

It is a still further object of the invention to provide a plural-emitter power transistor with a distributed Darlington driver.

It is a still further object of the invention to provide a plural-emitter power transistor with a sense emitter that is in close thermal contact with all of the plural emitters.

These and other objects are achieved as follows. An IC power transistor is composed of a plurality of emitters diffused into base region material in the form of an array of columns and rows. The individual emitters are contacted by a subsurface layer of polycrystalline silicon that is doped to the desired restivity. The subsurface layer is contoured to form resistor elements between the individual emitters and a contact region that connects to an overlying metal bus. The plural-emitters are contacted in groups which form the array rows. The subsurface layer can also serve as an intermediate cross-under layer. Each column bus connects a plurality of such groups to the emitter bus. An interdigitated array of collector bus lines makes contact to collector sinker diffusions that flank each of the columns in IC applications.

A metal base contact bus, which is intended to contact the base regions, sinuously traverses the columns in between the emitter and collector bus lines thereby making all of the column bases operate at the same potential. This base bus makes multiple ohmic contacts to the base diffusion at locations that are spaced adjacent to each emitter group. In the preferred embodiment each column employs an array of emitters that are diffused into a separate base region to form a Darlington driver. The driver emitters are connected to an enlarged portion of the base metal bus described above. The driver bases are connected via a cross-under to an input metal bus. Since the above-described base regions are diffused into a common collector region, the Darlington connection is completed automatically.

Another feature of the preferred embodiment is the sense emitter arrangement. Here a narrow elongated sense emitter is included in each column so as to traverse each row of emitters in that column. The sense emitter in each column is connected via a cross-under, to a common sense-emitter metal bus. Thus, all of the column sense emitters are coupled in parallel. A small current is pulled out of the sense bus so that all of the sense emitters can be functional. If the transistor develops a hot spot, the nearest portion of the sense emitters will pull the sense bus up to a potential, relative to the base bus, related to the temperature of the hot spot. Thus, by comparing the potentialtial of the sense bus with that of a reference potential, the dissipation of the transistor can be limited so that the hot spot temperature will not become excessive.

BRIEF DESCRIPTION OF THE DRAWING

FIG. 1 is an outline of the metallization on a portion (item 20) of an IC chip. The sense emitters and crossunders are also shown in dashed outline.

FIG. 2 is an outline drawing of an enlarged portion of the FIG. 1 showing. In this view, the upper metallization and passivation layers have been removed for clarity FIG. 3 is a cross-section of the IC chip of FIG. 2 taken at the line 3—3. In this section view the upper metallization and passivation layers are shown schematically. The drawing is not to scale, the vertical dimensions are exaggerated for clarity.

FIG. 4 is a schematic diagram that represents the various elements in the power transistor.

DESCRIPTION OF THE INVENTION

FIG. 1 shows an IC chip fragment 10 illustrating a portion of a power transistor. While three transistor columns are shown, any number could be employed. It is convenient to employ such trios so that the complete transistor will involve columns in multiples of three. While not illustrated in FIG. 1, each column will employ a plurality of rows of individual transistors. In the preferred embodiment fifteen rows are employed in the output section in each column. As will be detailed hereinafter, the rows are composed of four transistors per column.

Each column is composed of an output section (the main output transistor) and an individual Darlington driver. In the preferred embodiment the fifteen output section rows (sixty transistors) are driven by two Darlington driver rows (eight transistors).

Emitter metal 11 forms a bus which is extended finger wise along the columns to provide a connection to the individual emitters of the output section in each column. Collector metal 12 forms a bus which is extended finger wise to provide a collector connection flanking each column with metal. As will be shown hereinafter, the collector metal contacts are by way of sinkers that contact a buried conductive layer that extends underneath the power transistor structure.

The base metal bus 13 is extended in sinuous fashion to make contact with the output section transistor base at a plurality of points. Two contacts exist for each four individual emitters. The base metal is also extended in the Darlington driver section to contact the driver emitters. It is to be understood that the output transistor base metal bus extends along the columns to provide a plurality of contacts to the output section bases. Thus, all of the output transistor bases are at the same potential even though some portions of the drivers are hotter than others causing uneven conduction. The Darlington driver bases are separate and are contacted by input metal 14. Cross-unders 15 are shown in dashed outline and act to connect the Darlington driver bases to input metal bus line 16.

Each column also has a sense emitter 17 that will be described in more detail hereinafter. The sense emitters are connected via cross-unders 18 to sense emitter metal bus 19. From the above, it can be seen that all of the elements of the power transistor structure are available at the top surface of the IC chip. The emitter and collector metal 11 and 12 is made in relatively wide bus form so that considerable total current can be conducted. In the final structure the enlarged metal portions at each end of the column structure can include IC bonding pads that are employed to conduct the emitter and collector currents from the upper chip face. Conduction of heat generated by the power transistor is through the backside of the IC chip which must be thermally bonded to a power device housing (not shown).

FIG. 2 is an enlarged view of a portion 20 of chip 10 showing a four-emitter row structure. A portion of an adjacent row is also shown. FIG. 3 is a cross section of the structure taken at line 3—3 of FIG. 2. In FIG. 2 the upper metal layer and passivating oxide have been omitted for clarity.

Dashed outlines 13' represent where base contact is to be made to base metal bus line 13. As can be seen in FIG. 1 this metal bus sinuously traverses the output section bases. Each group of four emitters is associated with a pair of nearby base contacts.

Four individual emitters 21–24 are illustrated to make up a row. These are located inside base region 25. Emitter connector layer 26 is a subsurface layer located on top of a conventional planar passivating oxide layer 27 (not shown in FIG. 2). Layer 26 is preferred to be composed of polycrystalline silicon that is doped with an N type impurity. While polycrystalline silicon is the preferred material, other materials, capable of conducting at the desired level and capable of being insulated by silicon dioxide, can be employed. The doping and thickness of layer 26 are chosen to give a sheet resistance of typically about 35 ohms/square. Layer 26 is also employed for cross-unders 15 and 18 (described above) and is overcoated with an insulating oxide layer 28 (also not shown in FIG. 2).

Dashed outline contacts 29–32 represent apertures in passivating oxide 27 where layer 26 makes ohmic contact with emitters 21–24. Dashed outline 33 represents a large area contact to layer 26. This would represent an aperture in insulating oxide 28 where emitter bus metal 11 would make contact with layer 26.

Layer 26 is shaped to make contact with emitters 21–24 so that each emitter has a series resistance to contact 33. In the preferred embodiment the resistor paths in the legs at 34–37 provide about 80 ohms in series with each individual emitter. This will provide the required emitter ballasting for stable power transistor operation.

An N+ diffusion 17 forms a distributed emitter for sensing hot spots. Thus, the potential at emitter 17 referenced to the power transistor base and will be a function of the temperature along the extended sense emitter. Since the sense emitter traverses an entire column, its potential will be related to the hottest point along the column. If a power transistor develops a hot spot, due, for example, to a solder void on its backside, the sense emitter will heat up and its potential will reflect the poor heat transfer at the void. This means that the transistor dissipation can be reduced by well known control circuitry (not shown) to a level that will keep the hot spot below any damage level. This capability greatly enhances the reliability of the completed device.

The transistor structure is fabricated into a conventional IC N type epitaxial layer 38 located on a P type substrate 39. A conventional conductive N+ buried layer 40 extends under the power transistor structure. Sinker diffussion 41 extends through epitaxial layer 38 to contact buried layer 40. A conventional emitter diffusion 42 contacts the upper portion of sinker 41. Collector bus metal 12 ohmically contacts the uppermost portion of diffusion 42. This structure acts to minimize the transistor series collector resistance.

The actual collector is the epitaxial material located under base region 25. The thickness of this region and its resistivity will determine the transistor's collector breakdown voltage. These parameters will be controlled, in the conventional manner, to control the transistor performance.

FIG. 4 is a schematic diagram of a single cell of the power transistor. Each cell contains four emitters 21–24 with each one having a series ballast resistor 34–37. The FIG. 4 designations are taken from the other figures. It can be seen that the sense emitter 17 is common to all of the power transistor elements and the Darlington drivers in a column. Cross-unders 18 parallel connect all of the sense emitters to a common metal sense line 19.

In operation a small current is pulled out of the sense emitter line 19 and its potential, with respect to metal bus 13, determined. If any section of the power transistor develops a hot spot the sense emitter line potential will rise relative to the base. Therefore, the IC can be shut down by on chip circuitry (not shown) when any hot spot in the power device exceeds some predetermined limit. Because of the parallel connection of the sense emitters the potential on line 19 will be related to the hottest portion of the structure. Therefore, the sense emitter is effectively in very close proximity to all portions of the power device. By locating the sense emitter close to the power emitters very rapid thermal response is achieved.

While not illustrated, the entire power transistor is surrounded with a P+ isolation diffusion ring that extends completely through the epitaxial layer in the conventional IC manner. This diffusion provides PN junction isolation of the transistor and also provides an upper surface contact to substrate 39.

EXAMPLE

A ten ampere IC power transistor was constructed as described above. An array of nine columns was employed (three groups of three each as shown in FIG. 1). Each column had fifteen rows so as to include sixty transistors. Thus, the power transistor has 540 individual emitters to achieve a ten-ampere rating. Each emitter would account for about 18.5 milliamperes. Two such power transistors and Darlington drivers were incorporated into a chip measuring 164 mils×179 mils (4170×4550 microns) to form a high-power op amp. Together they occupied about 60% of the total chip area. Using a ±40 volt supply the output swing was ±35 volts at 10 amperes. The maximum continuous device dissipation was 90 watts with a case temperature of 25° C. The peak output current was 12 amperes and the peak power dissipation was 800 watts. A 4-ohm load could be driven to 150 RMS watts. The slew rate was 6 volts per microsecond. The Darlington driven power transistor had a d-c current gain of better than 5000 and had a saturation voltage maximum of 3 volts at 10 amperes.

The invention has been described and an operating example detailed. When a person skilled in the art reads the foregoing description, alternatives and equivalents, within the spirit and intent of the invention, will be apparent. For example, while the invention is described with reference to an IC, a discrete power transistor could easily be fabricated in the same manner. Accordingly, it is intended that the scope of the invention be limited only by the following claims.

I claim:

1. A power transistor of monolithic planar oxide-passivated, semiconductor construction said power transistor including a plurality of parallel-connected individual elements and comprising:
   a semiconductor substrate of a first conductivity type;
   a plurality of elongated base regions located in said substrate and extending from a first surface thereof into said substrate and having an opposite conductivity type, said plurality of elongated base regions being arrayed to form a plurality of columns on the face of said first surface of said semiconductor body;
   a plurality of individual emitters of said first conductivity type located within the confines of each of said base regions and extending part way through said base regions;
   a planar passivating oxide located on said first surface of said semiconductor substrate whereby the pn junctions created by said base regions and said emitters are passivated, said planar passivating oxide having apertures located within the confines of each of said emitters and each of said base regions whereby contact is made thereto;
   a resistive layer located on top of said planar oxide so that each of said emitters are contacted through said planar passivating oxide apertures, said resistive layer being contoured so that it provides a ballast resistor function coupled in series with each of said individual emitters, said resistive layer additionally providing a conductive cross under layer for said power transistor;
   an insulating layer located on top of said resistive layer and having apertures therein where contact is to be made to said resistive layer;
   a plurality of elongated emitter bus metal lines locates on top of said insulating layer whereby contact is made to each of the emitters in said columns through said resistive layer by way of said apertures in said insulating layer and whereby each of said emitter bus metal lines can be made to have substantial width and be located directly over active emitter areas without compromising their function, said emitter metal bus lines being extended along one end of said columns to interconnect the emitters in said columns to form a unitary emitter electrode;
   means for making low resistance ohmic connections to couple into said base region via said conductive cross-under layer and means for making contact from the first surface of said semiconductor substrate to provide a collector contact to said semiconductor substrate.

2. The power transistor of claim 1 wherein said resistive material is composed of polycrystalline silicon.

3. The power transistor of claim 2 wherein said polycrystalline silicon is doped with an impurity of said first conductivity type.

4. The power transistor of claim 1 further comprising a plurality of collector bus metal lines having extensions located along the flanking edges of said columns and interdigitated with said emitter bus metal lines to make low resistance contact to said collector body, said collector bus metal lines extending beyond the other ends of said columns to parallel connect said extensions.

5. The power transistor of claim 1 further comprising a sense emitter for each column extending along said base region in proximity with said individual emitters and coupled via said conductive cross-under layer to a common sense line.

6. The power transistor of claim 1 further comprising a power driver section associated with each column whereby all of the individual transistors in each of said columns are driven by a separate power driver.

7. The power transistor of claim 6 wherein said power drivers are coupled via said conductive cross-under layer to a common signal input line.

* * * * *